United States Patent
Azadet

(10) Patent No.: US 9,813,224 B2
(45) Date of Patent: Nov. 7, 2017

(54) DIGITAL PROCESSOR HAVING INSTRUCTION SET WITH COMPLEX ANGLE FUNCTION

(71) Applicant: Intel Corporation, Santa Clara, CA (US)

(72) Inventor: Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 312 days.

(21) Appl. No.: 14/255,491

(22) Filed: Apr. 17, 2014

(65) Prior Publication Data

US 2014/0317376 A1 Oct. 23, 2014

Related U.S. Application Data

(60) Provisional application No. 61/812,858, filed on Apr. 17, 2013.

(51) Int. Cl.
*G06F 15/00* (2006.01)
*G06F 7/38* (2006.01)
(Continued)

(52) U.S. Cl.
CPC ........ *H04L 5/1461* (2013.01); *G06F 9/30036* (2013.01); *G06F 17/15* (2013.01);
(Continued)

(58) Field of Classification Search
None
See application file for complete search history.

(56) References Cited

U.S. PATENT DOCUMENTS 4,884,265 A * 11/1989 Schroeder ................ H04J 1/05
370/484
4,896,287 A * 1/1990 O'Donnell ............ G06F 7/4812
708/622

(Continued)

OTHER PUBLICATIONS

"U.S. Appl. No. 14/230,607, Examiner Interview Summary dated Feb. 9, 2016", 3 pgs.

(Continued)

*Primary Examiner* — George Giroux
(74) *Attorney, Agent, or Firm* — Schwegman Lundberg & Woessner, P.A.

(57) ABSTRACT

A digital processor, such as a vector processor or a scalar processor, is provided having an instruction set with a complex angle function. A complex angle is evaluated for an input value, x, by obtaining one or more complex angle software instructions having the input value, x, as an input; in response to at least one of the complex angle software instructions, performing the following steps: invoking at least one complex angle functional unit that implements the one or more complex angle software instructions to apply the complex angle function to the input value, x; and generating an output corresponding to the complex angle of the input value, x, using one or more multipliers of a Multiply Accumulate (MAC) unit of the digital processor, wherein the complex angle software instruction is part of an instruction set of the digital signal processor. Multiplication operations optionally employ one or more multipliers of the MAC unit of the digital processor.

16 Claims, 2 Drawing Sheets

COMPUTE PHASE OF A COMPLEX NUMBER x — 200

```
function θ=arg(x)
Nbit=16
210 — su=sign(imag(x))
if(imag(x)=0) su=1 end
u=x
y=0
for(k=2 to Nbit)
    ep(k)=angle(pi*j/2^(k-1))
    em(k)=conj(ep(k))
    if(su>0) u=u*em(k)
    else u=u*ep(k)
    end
    y=y+su*pi/2^(k-1)
    su=sign(imag(u))
    if(imag(u)=0) su=1 end
end
220 — Return θ=y
```

(51) Int. Cl.

| | | |
|---|---|---|
| G06F 9/00 | (2006.01) | |
| G06F 9/44 | (2006.01) | |
| H04L 5/14 | (2006.01) | |
| H04L 25/08 | (2006.01) | |
| G06F 17/50 | (2006.01) | |
| H04B 1/62 | (2006.01) | |
| H04L 1/00 | (2006.01) | |
| H04B 1/04 | (2006.01) | |
| G06F 17/15 | (2006.01) | |
| G06F 9/30 | (2006.01) | |
| H04L 25/03 | (2006.01) | |
| H04L 27/36 | (2006.01) | |
| H04J 11/00 | (2006.01) | |
| H04B 1/525 | (2015.01) | |

(52) U.S. Cl.
CPC .......... *G06F 17/50* (2013.01); *G06F 17/5009* (2013.01); *H04B 1/0475* (2013.01); *H04B 1/525* (2013.01); *H04B 1/62* (2013.01); *H04J 11/004* (2013.01); *H04L 1/0043* (2013.01); *H04L 25/03012* (2013.01); *H04L 25/03343* (2013.01); *H04L 25/08* (2013.01); *H04L 27/367* (2013.01); *H04L 27/368* (2013.01); *H04B 2001/0425* (2013.01)

(56) References Cited

U.S. PATENT DOCUMENTS

| | | | |
|---|---|---|---|
| 5,903,611 | A | 5/1999 | Schnabl et al. |
| 6,298,097 | B1 | 10/2001 | Shalom |
| 6,496,609 | B1 | 12/2002 | Walter |
| 6,587,514 | B1 | 7/2003 | Wright et al. |
| 6,798,843 | B1 | 9/2004 | Wright et al. |
| 6,801,086 | B1 | 10/2004 | Chandrasekaran |
| 7,058,369 | B1 | 6/2006 | Wright et al. |
| 7,242,725 | B2 | 7/2007 | Matsumoto et al. |
| 7,315,530 | B2 | 1/2008 | Castelain et al. |
| 7,924,942 | B2 | 4/2011 | Rexberg |
| 8,331,509 | B2 | 12/2012 | Wang et al. |
| 8,498,591 | B1 | 7/2013 | Qian et al. |
| 9,225,501 | B2 | 12/2015 | Azadet |
| 2001/0050592 | A1 | 12/2001 | Wright et al. |
| 2002/0101938 | A1 | 8/2002 | Horaguchi et al. |
| 2002/0152248 | A1 | 10/2002 | Bentz |
| 2004/0001559 | A1 | 1/2004 | Pinckley et al. |
| 2004/0248516 | A1 | 12/2004 | Demir et al. |
| 2005/0116775 | A1 | 6/2005 | Mcbeath et al. |
| 2005/0140438 | A1 | 6/2005 | Jin et al. |
| 2005/0243946 | A1 | 11/2005 | Chung et al. |
| 2005/0253745 | A1 | 11/2005 | Song et al. |
| 2007/0086134 | A1* | 4/2007 | Zweigle ............. G01R 19/2513 361/85 |
| 2008/0030388 | A1 | 2/2008 | Muck et al. |
| 2008/0123770 | A1 | 5/2008 | Copeland |
| 2008/0133982 | A1 | 6/2008 | Rawlins et al. |
| 2008/0144539 | A1 | 6/2008 | Sperlich et al. |
| 2009/0051425 | A1 | 2/2009 | Mehta et al. |
| 2009/0051426 | A1 | 2/2009 | Ba et al. |
| 2009/0256632 | A1 | 10/2009 | Klingberg et al. |
| 2010/0105338 | A1 | 4/2010 | Wang et al. |
| 2010/0138463 | A1 | 6/2010 | Azadet et al. |
| 2010/0138464 | A1 | 6/2010 | Azadet et al. |
| 2010/0138465 | A1 | 6/2010 | Azadet et al. |
| 2010/0138468 | A1* | 6/2010 | Azadet .................. G06F 9/3001 708/511 |
| 2010/0316157 | A1 | 12/2010 | Bassam et al. |
| 2011/0080216 | A1 | 4/2011 | Mujica et al. |
| 2011/0149714 | A1 | 6/2011 | Rimini et al. |
| 2011/0228828 | A1 | 9/2011 | Wang et al. |
| 2012/0269292 | A1 | 10/2012 | Wang et al. |
| 2012/0269293 | A1 | 10/2012 | Peng et al. |
| 2013/0162349 | A1 | 6/2013 | Gao et al. |
| 2013/0243123 | A1 | 9/2013 | Bai |
| 2013/0336377 | A1 | 12/2013 | Liu et al. |
| 2014/0086361 | A1 | 3/2014 | Azadet et al. |
| 2014/0218107 | A1 | 8/2014 | Geng et al. |
| 2014/0313946 | A1 | 10/2014 | Azadet |
| 2014/0314176 | A1 | 10/2014 | Azadet |
| 2014/0314181 | A1 | 10/2014 | Azadet |
| 2014/0316752 | A1 | 10/2014 | Azadet |

OTHER PUBLICATIONS

"U.S. Appl. No. 14/230,607, Final Office Action dated Jun. 2, 2016", 14 pgs.
"U.S. Appl. No. 14/230,607, Non Final Office Action dated Nov. 19, 2015", 15 pgs.
"U.S. Appl. No. 14/230,607, Response filed Feb. 19, 2016 to Non Final Office Action dated Nov. 19, 2015", 11 pgs.
"U.S. Appl. No. 14/230,622, Non Final Office Action dated Apr. 14, 2015", 22 pgs.
"U.S. Appl. No. 14/230,622, Notice of Allowance dated Aug. 28, 2015", 14 pgs.
"U.S. Appl. No. 14/230,622, Response filed Jul. 14, 2015 to Non Final Office Action dated Apr. 14, 2015", 14 pgs.
"U.S. Appl. No. 14/230,635, Final Office Action dated Jun. 30, 2016", 13 pgs.
"U.S. Appl. No. 14/230,635, Non Final Office Action dated Dec. 4, 2015", 17 pgs.
"U.S. Appl. No. 14/230,635, Response filed Mar. 4, 2016 to Non Final Office Action dated Dec. 4, 2015", 11 pgs.
"Bilinear interpolation", Wikipedia, [Online] retrieved from the internet <https://web.archive.org/web/20110921104425/http://en.wikipedia.org/wiki/Bilinear_interpolation>, (Sep. 21, 2011).
Jin, Minglu, et al., "A fast LUT predistorter for power amplifier in OFDM systems", in Personal, Indoor and Mobile Radio Communications, 2003. PIMRC 2003. 14th IEEE Proceedings on, vol. 2, No., (Sep. 7-10, 2003), 1894-1897.
Li, Hao, et al., "A Fast Digital Predistortion Algorithm for Radio-Frequency Power Amplifier Linearization With Loop Delay Compensation", in Selected Topics in Signal Processing, IEEE Journal of, vol. 3, No. 3, (Jun. 2009), 374-383.
Lu, Chao, et al., "A 24.7 dBm all-digital RF transmitter for multimode broadband application sin 40nm CMOS", in Solid-State Circuits Conference Digest of Technical Papers (ISSCC), 2013 IEEE International, vol., No., (Feb. 17-21, 2013), 332-333.
Nagata, Y, "Linear amplification technique for digital mobile communications", in Vehicular Technology Conference, 1989, IEEE 39th, vol.,No. 1, (May 1989), 159-164.
"U.S. Appl. No. 14/168,621, Final Office Action dated Mar. 29, 2017", 17 pgs.
"U.S. Appl. No. 14/168,621, Non Final Office Action dated Oct. 20, 2016", 13 pgs.
"U.S. Appl. No. 14/168,621, Response filed Jan. 10, 2017 to Non Final Office Action dated Oct. 20, 2016", 13 pgs.
"U.S. Appl. No. 14/230,635, Advisory Action dated Nov. 15, 2016", 6 pgs.
"U.S. Appl. No. 14/230,635, Examiner Interview Summary dated Oct. 31, 2016", 3 pgs.
"U.S. Appl. No. 14/230,635, Non Final Office Action dated Jan. 18, 2017", 14 pgs.
"U.S. Appl. No. 14/230,635, Response filed Oct. 31, 2016 to Final Office Action dated Jun. 30, 2016", 9 pgs.
"U.S. Appl. No. 14/230,635, Response filed Nov. 30, 2016 to Final Office Action dated Jun. 30, 2016", 9 pgs.
Kim, et al., "Digital predistortion of wideband signals based on power amplifier model with memory", IEEE, (2001).
Pere Lluis, et al., "Multi Look-Up Table Digital Predistortion for RF Power Amplifier Linearization", Universität Politecnica de Catalunya, (2007).

* cited by examiner

COMPUTE PHASE OF A COMPLEX NUMBER x — 200

```
function θ=arg(x)
Nbit=16
210 — su=sign(imag(x))
if(imag(x)=0) su=1 end
u=x
y=0
for(k=2 to Nbit)
    ep(k)=angle(pi*j/2^(k-1))
    em(k)=conj(ep(k))
    if(su>0) u=u*em(k)
    else u=u*ep(k)
    end
    y=y+su*pi/2^(k-1)
    su=sign(imag(u))
    if(imag(u)=0) su=1 end
end
220 — Return θ=y
```

DIGITAL PROCESSOR HAVING INSTRUCTION SET WITH COMPLEX ANGLE FUNCTION

CROSS-REFERENCE TO RELATED APPLICATIONS

The present application claims priority to U.S. Patent Provisional Application Ser. No. 61/812,858, filed Apr. 17, 2013, entitled "Digital Front End (DFE) Signal Processing," incorporated by reference herein.

The present application is related to U.S. patent application Ser. No. 12/324,926, filed Nov. 28, 2008, entitled "Digital Signal Processor Having Instruction Set with One or More Non-Linear Complex Functions;" U.S. patent application Ser. No. 12/324,927, filed Nov. 28, 2008, entitled "Digital Signal Processor Having Instruction Set With One or More Non-Linear Functions Using Reduced Look-Up Table;" U.S. patent application Ser. No. 12/324,934, filed Nov. 28, 2008, entitled "Digital Signal Processor With One or More Non-Linear Functions Using Factorized Polynomial Interpolation;" U.S. patent application Ser. No. 12/362,874, filed Jan. 30, 2009, entitled "Digital Signal Processor Having Instruction Set With an Xk Function Using Reduced Look-Up Table," and U.S. patent application Ser. No. 13/701,397, filed Nov. 30, 2012, entitled "Digital Signal Processor Having Instruction Set With Complex Angle Non-Linear Function," each incorporated by reference herein.

FIELD OF THE INVENTION

The present invention is related to digital processing techniques and, more particularly, to techniques for digital processing of complex angle functions.

BACKGROUND OF THE INVENTION

Digital signal processors (DSPs) are special-purpose processors utilized for digital processing. Signals are often converted from analog form to digital form, manipulated digitally, and then converted back to analog form for further processing. Digital signal processing algorithms typically require a large number of mathematical operations to be performed quickly and efficiently on a set of data. DSPs thus often incorporate specialized hardware to perform software operations that are often required for math-intensive processing applications, such as addition, multiplication, multiply-accumulate (MAC), and shift-accumulate.

A complex number is a number that can be expressed in the form a+bi, where a is the real part and b is the imaginary part of the complex number. The function angle(Z) computes the phase angle, in radians, for each element of a complex array Z. The computed angles are between ±π. Existing DSPs, however, do not provide specialized instructions to support complex angle functions. Increasingly, however, there is a need for complex angle operations in processors. For example, complex angle operations are needed for phase error estimation and frequency error estimation. CORDIC (Coordinate Rotation Digital Computer) hardware is often used to perform complex angle operations. Adding such specialized hardware blocks in a vector processor, however, can be costly, particularly if the vector processor uses high level SIMD (Single Instruction Multiple Data) parallelism (e.g., 128-way).

A need therefore exists for digital processors, such as vector processors, having an instruction set that efficiently supports a complex angle function.

SUMMARY OF THE INVENTION

Generally, a digital processor is provided having an instruction set with a complex angle function. According to one aspect of the invention, the disclosed digital processor evaluates a complex angle for an input value, x, by obtaining one or more complex angle software instructions having the input value, x, as an input; in response to at least one of the complex angle software instructions, performing the following steps: invoking at least one complex angle functional unit that implements the one or more complex angle software instructions to apply the complex angle function to the input value, x; and generating an output corresponding to the complex angle of the input value, x, using one or more multipliers of a Multiply Accumulate (MAC) unit of the digital processor, wherein the complex angle software instruction is part of an instruction set of the digital signal processor.

In one exemplary embodiment, the complex angle instruction computes the phase of an input complex number by successive approximation, computing a rotated version initialized to the input complex number at a first iteration, and at iteration k rotating the rotated signal from a previous iteration by $\text{sign}(k)*\pi*2^k$ to produce a new rotated input, where sign(k) is opposite of the sign of the imaginary part of the rotated number at the previous iteration. A magnitude of the complex number is optionally produced as the real part of the rotated number from a previous iteration. In this case, the disclosed angle function leverages the MAC unit of the vector processor as is, by computing the result in Nbit clock cycles (where Nbit is the required accuracy of the angle in number of bits). This operation can be performed with no extra hardware cost, since a vector processor already has a MAC unit.

According to another aspect of the invention, the multiplication operations required by the disclosed complex angle function employ one or more multipliers of the MAC unit of the digital processor. In this configuration, a number of multipliers in the MAC unit are configured in a pipeline fashion to compute one vector angle(Z) every N2 cycles, where $1<=N2<=Nbit$.

The digital processor executes software instructions from program code and can be, for example, a vector processor or a scalar processor. A vector processor implementation can compute the argument of multiple complex numbers simultaneously.

A more complete understanding of the present invention, as well as further features and advantages of the present invention, will be obtained by reference to the following detailed description and drawings.

DETAILED DESCRIPTION

Aspects of the present invention provide a digital processor that supports a complex angle function. As used herein, the term "digital processor" shall be a processor that executes instructions in program code, such as a DSP or a vector processor. It is further noted that the disclosed complex angle function can be applied for values of x that are scalar or vector inputs.

Figures 1, 2:
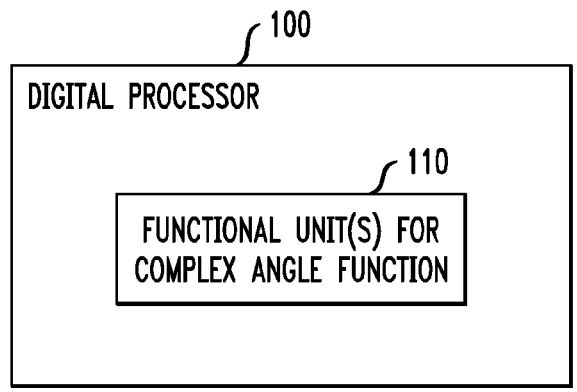
FIG. 1 is a schematic block diagram of an exemplary digital processor that incorporates features of the present invention.
FIG. 2 provides exemplary pseudo code for an exemplary implementation of a complex angle function computation process that incorporates features of the present invention.

FIG. 1 is a schematic block diagram of an exemplary digital processor 100 that incorporates features of the present invention. The exemplary digital processor 100 can be implemented as a DSP or a vector processor. As shown in FIG. 1, the exemplary digital processor 100 includes one or more functional units 110 for complex angle functions.

Generally, if the digital processor 100 is processing software code that includes a predefined instruction keyword corresponding to a complex angle function and any appropriate operands for the function, the instruction decoder must trigger the appropriate complex angle functional units 110 that are required to process the instruction. It is noted that a complex angle functional unit 110 can be shared by more than one instruction.

Generally, aspects of the present invention extend conventional digital processors to provide an enhanced instruction set that supports complex angle functions. The digital processor 100 in accordance with aspects of the present invention receives at least one complex number as input, applies a complex angle function to the input and generates an output value comprised of a phase angle, in radians.

As noted above, CORDIC (Coordinate Rotation Digital Computer) hardware is traditionally used to perform complex angle operations. CORDIC is a hardware block/algorithm that also computes the angle function. See, for example, Jack E. Volder, "The CORDIC Trigonometric Computing Technique," IRE Transactions on Electronic Computers, 330-334 (September 1959). Aspects of the present invention provide an alternative to CORDIC. Although CORDIC is an efficient hardware implementation of phase calculation, adding a CORDIC to a processor as a specialized functional unit (or multiple CORDICs in the case of a vector processor) can lead to significant increase of area and power of a processor/vector processor. One aspect of the invention re-uses the existing CMAC unit of the processor and implements phase calculation with minimal additional hardware (e.g., comparators and multiplexers), or alternatively to compute the phase calculation in a vector processor iteratively without need for any additional hardware.

The present invention can also be used to extend, for example, a MATLAB (matrix laboratory) computing environment. See, for example, Amos Gilat, MATLAB: An Introduction with Applications 2nd Edition. John Wiley & Sons (ISBN 978-0-471-69420-5, 2004), incorporated by reference herein.

The disclosed digital processors 100 may have a scalar architecture, as shown in FIG. 1, that processes a single number at a time, or a vector architecture, as discussed hereinafter in conjunction with FIG. 3, that processes one or more numbers simultaneously. In the case of a vector-based digital processor implementation, the input number is a vector comprised of a plurality of complex numbers that are processed in parallel.

As noted above, a complex number is a number that can be expressed in the form a+bi, where a is the real part and b is the imaginary part of the complex number. The function angle(Z) computes the phase angle, in radians, for each element of a complex array Z. The computed angles lie between ±π. For a complex value Z, the magnitude R and the phase angle Θ of Z are given by the following expressions:

$$R = abs(Z); \text{ and}$$

$$\Theta = angle(Z).$$

FIG. 2 provides exemplary pseudo code for an exemplary implementation of a complex angle function computation process 200 with exemplary 16 bit accuracy that incorporates features of the present invention to compute angle(x). Generally, the exemplary complex angle function computation process 200 computes the angle (phase) of a complex number x by successive approximation, by rotating the input x by π, π/2, π/4, π/8, etc. clockwise (positive sign) or counter-clockwise (negative sign) depending on whether the resulting imaginary part is positive or negative (as determined during step 210) and returns the angle Θ during step 220 as: $\pi*(\Sigma s(k)*2^k)$. A rotated version initialized to the input complex number is computed at a first iteration, and then at a subsequent iteration k, the rotated signal from a previous iteration is further rotated by $sign(k)*\pi*2^k$ to produce a new rotated input, where sign(k) is opposite of the sign of the imaginary part of the rotated number at the previous iteration. The multiplication operations can optionally leverage the multipliers of the Multiply Accumulate (MAC) unit of the digital processor.

In one exemplary implementation, the disclosed angle function leverages the MAC unit of the vector processor as is, by computing the result in Nbit clock cycles (where Nbit is the required accuracy of the angle in number of bits). This operation can be performed with no extra hardware cost, since a vector processor already has a MAC unit.

In a further variation, the multiplication operations required by the disclosed complex angle function employ one or more multipliers of the MAC unit of the digital processor. In this configuration, a number of multipliers in the MAC unit are configured in a pipeline fashion to compute one vector angle(Z) every N2 cycles, where 1<=N2<=Nbit.

Figure 3:
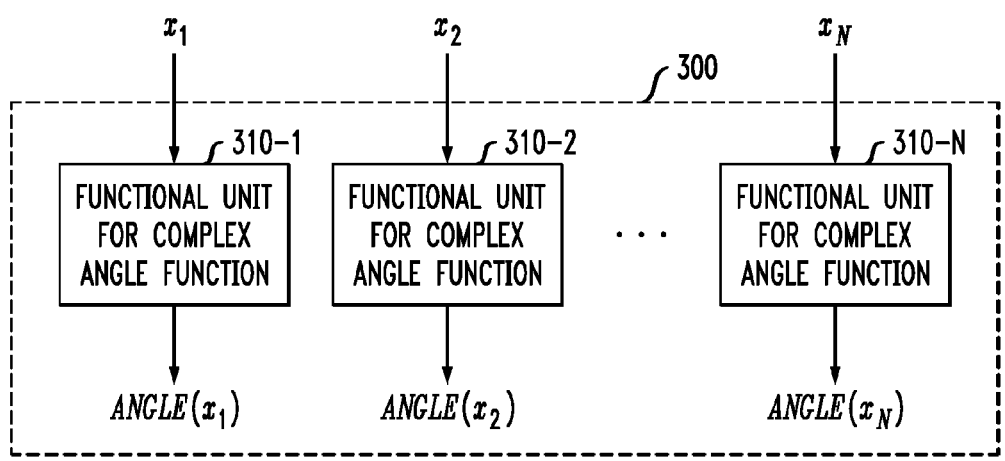
FIG. 3 is a schematic block diagram of an exemplary vector-based digital processor that processes one or more real numbers simultaneously in accordance with an embodiment of the present invention.

FIG. 3 is a schematic block diagram of an exemplary vector-based digital processor 300 that processes one or more complex numbers simultaneously in accordance with an embodiment of the present invention. Generally, the vector-based implementation of FIG. 3 performs different angle function processes concurrently, as opposed to the scalar implementation of FIG. 1. Thus, the vector-based digital processor 300 contains plural functional units for complex angle functions 310-1 through 310-N. For example, a dual digital processor 300 contains two functional units 310-1 and 310-2 that are capable of performing two independent complex angle function operations concurrently.

Generally, the vector-based digital processor 400 processes a vector of complex inputs x and generates a vector of outputs, angle(x).

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware.

Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

I claim:

1. A method performed by a digital processor for evaluating a complex angle for an input value, x, comprising:
   obtaining one or more complex angle software instructions having said input value, x, as an input;
   in response to at least one of said complex angle software instructions, performing the following steps:
      invoking at least one complex angle functional unit that implements said one or more complex angle software instructions to apply said complex angle function to said input value, x; and
      generating an output corresponding to said complex angle of said input value, x, using one or more multipliers of a Multiply accumulate (MAC) unit of said digital processor,
         wherein said complex angle software instruction is part of an instruction set of said digital signal processor, and
         wherein said complex angle instruction computes the phase of an input complex number by successive approximation, computing a rotated version initialized to the input complex number at a first iteration, and at iteration k rotating the rotated signal from a previous iteration to produce a new rotated input.

2. The method of claim 1, further comprising the step of producing a magnitude of the complex number as the real part of the rotated number from a previous iteration.

3. The method of claim 1, wherein said multiplication operations employ said one or more multipliers of said MAC unit of said digital processor.

4. The method of claim 1, wherein said digital processor executes software instructions from program code.

5. The method of claim 1, wherein said digital processor comprises one or more of a vector processor and a scalar processor.

6. The method of claim 5, wherein said vector processor computes the argument of multiple complex numbers simultaneously.

7. The method of claim 1, wherein said digital processor further comprises a polar conversion software instruction implemented using said at least one complex angle functional unit in conjunction with at least one magnitude functional unit.

8. The method of claim 1 wherein at iteration k the rotated signal is rotated by $\text{sign}(k)*\pi*2^k$ to produce a new rotated input, where sign (k) is opposite of the sign of the imaginary part of said rotated number at said previous iteration.

9. A digital processor that evaluates a complex angle function for an input value, x, the complex angle having a magnitude component and a phase angle component, comprising:
   A memory; and
   at least one hardware device, coupled to the memory, operative to:
      obtain one or more complex angle software instructions having said input value, x, as an input and in response to at least one of said complex angle software instructions, performing the following:
         invoke at least one complex angle functional unit that implements said one or more complex angle software instructions to apply said complex angle function to said input value, x; and
      generate an output corresponding to said complex angle of said input value, x, using one or more multipliers of a Multiply Accumulate (MAC) unit of said digital processor, wherein said complex angle instruction computes the phase of an input complex number by successive approximation, computing a rotated version initialized to the input complex number at a first iteration, and at iteration k rotating said rotated signal from a previous iteration to produce a new rotated input.

10. The digital processor of claim 9, wherein said at least one hardware device is further configured to produce a magnitude of the complex number as the real part of the rotated number from a previous iteration.

11. The digital processor of claim 9, wherein said multiplication operations employ said one or more multipliers of said MAC unit of said digital processor.

12. The digital processor of claim 9, wherein said digital processor executes software instructions from program code.

13. The digital processor of claim 9, wherein said digital processor is embodied as one or more of a vector processor and a scalar processor.

14. The digital processor of claim 13, wherein said vector processor computes the argument of multiple complex numbers simultaneously.

15. The digital processor of claim 9, further comprising a polar conversion software instruction implemented using said at least one complex angle functional unit in conjunction with at least one magnitude functional unit.

16. The digital processor of claim 9 wherein at iteration k the rotated signal is rotated by $\text{sign}(k)*\pi*2^k$ to produce a new rotated input, where sign (k) is opposite of the sign of the imaginary part of said rotated number at said previous iteration.

* * * * *

UNITED STATES PATENT AND TRADEMARK OFFICE
CERTIFICATE OF CORRECTION

| | |
|---|---|
| PATENT NO. | : 9,813,224 B2 |
| APPLICATION NO. | : 14/255491 |
| DATED | : November 7, 2017 |
| INVENTOR(S) | : Kameran Azadet |

It is certified that error appears in the above-identified patent and that said Letters Patent is hereby corrected as shown below:

In the Claims

In Column 6, Line 15, in Claim 9, delete "A" and insert --a-- therefor

Signed and Sealed this
Sixteenth Day of July, 2019

Andrei Iancu
*Director of the United States Patent and Trademark Office*